United States Patent [19]
Luryi

[11] Patent Number: 4,829,349
[45] Date of Patent: May 9, 1989

[54] TRANSISTOR HAVING VOLTAGE-CONTROLLED THERMIONIC EMISSION

[75] Inventors: Sergey Luryi, Millington, N.J.; Redoulf F. Kazarinov, Martinsville, N.J.

[73] Assignee: American Telephone and Telegraph Company, AT&T Bell Laboratories, Murray Hill, N.J.

[21] Appl. No.: 509,321

[22] Filed: Jun. 30, 1983

[51] Int. Cl.$^4$ .............................................. H01L 29/78
[52] U.S. Cl. ...................................... 357/23.1; 357/42
[58] Field of Search ....................... 357/13, 22, 23, 15, 357/58, 23.1, 23.14

[56] References Cited

U.S. PATENT DOCUMENTS

| | | | |
|---|---|---|---|
| 4,149,174 | 4/1979 | Shannon | 357/15 |
| 4,317,127 | 2/1982 | Nishizawa | 357/22 |
| 4,410,902 | 10/1983 | Malik | 357/58 |

OTHER PUBLICATIONS

C. O. Bozler et al., "Fabrication and Numerical Simulation of the Permeable Base Transistor," *IEEE Transactions on Electron Devices*, vol. ED-27, No. 6, Jun., 1980, pp. 1128-1141.

J. Nishizawa et al., "Field-Effect Transistor Versus Analog Transistor (Static Induction Transistor)," *IEEE Transactions on Electron Devices*, vol. ED-22, No. 4, Apr., 1975, pp. 185-197.

*Primary Examiner*—William D. Larkins
*Attorney, Agent, or Firm*—Peter A. Businger

[57] ABSTRACT

A transistor device using an interdigitated gate and electrode surface structure to control thermionic emission over a potential barrier is described. Complementary logic structures comprising such transistors are discussed.

12 Claims, 2 Drawing Sheets

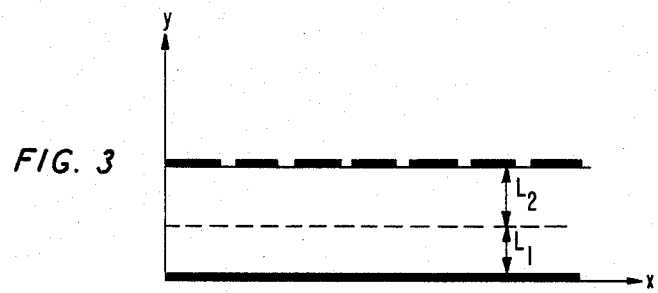
FIG. 3
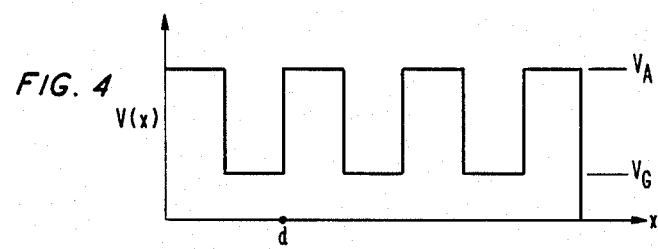
FIG. 4
FIG. 5
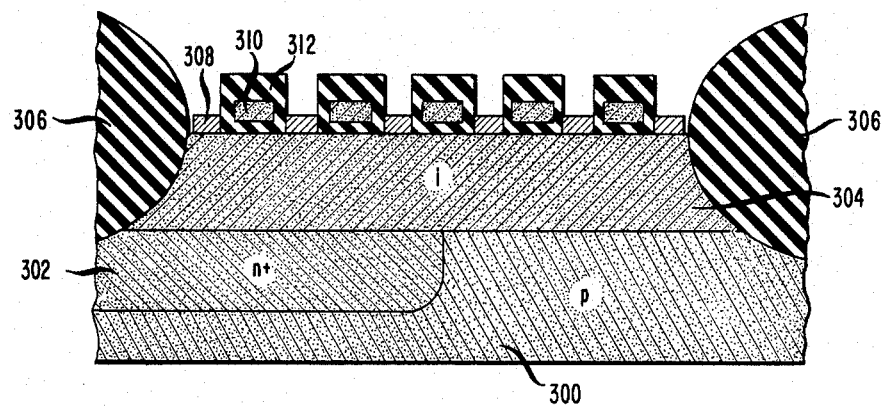
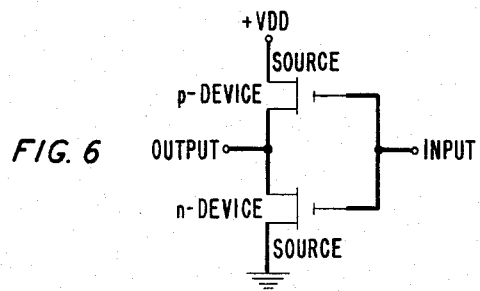
FIG. 6

TRANSISTOR HAVING VOLTAGE-CONTROLLED THERMIONIC EMISSION

TECHNICAL FIELD

This invention relates generally to semiconductor devices such as transistors and particularly to transistors having voltage-controlled thermionic emission.

BACKGROUND OF THE INVENTION

Beginning with the invention of the bipolar transistor, modern technology has increasingly sought devices that are both smaller and faster than are prior art devices. One important development in the search for faster devices was the field effect transistor (FET). The first realizable FET was the junction field effect transistor (JFET) which was first analyzed in detail by Shockley in 1952. A JFET is essentially a voltage-controlled resistor which has many attractive features that make its use desirable in applications such as, for example, switching, amplifiers, and integrated circuits. Another type of FET is the metal-oxide-semiconductor field effect transistor (MOSFET) which is currently the most important device for integrated circuits used in applications such as memories. Field effect transistors are unipolar devices, that is, their current conduction primarily involves only one type of carrier, and do not suffer from minority carriage storage effects as do bipolar transistors. Field effect transistors therefore should have higher speeds and cut-off frequencies than do bipolar devices.

Above the threshold, a MOSFET is basically a field effect device. The field effect arises from the screening of the electric field under the gate electrode by either an accumulation or depletion of mobile charges in the channel. However, in its subthreshold regime, the drain current in a MOSFET is due to thermionic emission from the source which plays a role that is analogous to that of a cathode. The potential barrier between the source and the channel decreases linearly with the band bending which is controlled by the gate voltage. In this regime, i.e., subthreshold, the MOSFET may be viewed as a potential effect rather than a field effect device.

Device operation in the subthreshold regime, rather than the threshold regime, would have several desirable attributes. The transconductance increases with the gate voltage, $V_G$, only in the subthreshold regime. That is, an increase in $V_g$ beyond threshold does not yield an advantage in speed since both the output current, I, and the capacitively stored charge, Q, are, above threshold, proportional to the gate voltage. The response time, $\tau$, which is proportional to Q/I, therefore, does not improve further.

However, while the charge injection, i.e., potential effect, mode of operation of FETs is theoretically more attractive than the field effect mode, the latter mode is preferred in practice. One reason for this preference is the fact that high values of output current cannot be achieved in the subthreshold regime. For an oxide thickness of approximately 500 Angstroms and a saturated velocity of approximately $10^7$ cm/sec, the maximum current that a device can produce is typically of the order of $10^{-2}$ A/cm of gate width. The subthreshold current is thus generally insufficient for fast device operation because of the parasitic capacitances.

There is also a second reason why FETs are generally not operated in their subthreshold regime. This reason is due to the uncertainty in the threshold voltage that necessarily results from variations in processing. The voltage swing must be reduced to several kT/q for a sufficiently small uncertainty and unfortunately, the reproducibility of device parameters, such as the surface condition, makes it difficult, if not impossible, with current technology, to control the height and shape of the potential barrier.

Several structures have been proposed in which the height of the barrier is controlled by an externally applied voltage. For example, *IEEE Transactions on Electron Devices*, ED-27, pp. 1128-1141, June 1980, proposes a structure that is termed a permeable-base transistor. The ideal structure proposed has a thin metal grating embedded in a single semiconductor crystal. The metal grating forms a base contact and is positioned in the semiconductor crystal between the collector and emitter contacts. The metal grating forms a Schottky barrier with the semiconductor and controls the flow of electrons from the emitter to collector. This device constituted an improvement on what is commonly termed, by those in the art, the static induction transistor. This type of transistor was described in *IEEE Transactions on Electron Devices*, ED-22, pp. 185-197, April 1975. Controlling electrodes in this transistor structure were formed by highly doped regions which were complementary to the source.

While these devices may be advantageously employed in some applications, they are not ideal devices for all applications for several reasons. For example, the permeable-base transistor faces practical problems in its implementation as high quality semiconductor material must be grown over the metallic grid and in practice, this is often difficult.

SUMMARY OF THE INVENTION

We have found that in a transistor having an interdigitated gate-anode surface electrode structure, independent control of the anode current by the gate voltage is permitted as the surface electrodes, i.e., the gate and anode electrodes, control the height of the potential barrier over which the current flows. Our device may thus be termed a thermionic emission transistor having a barrier whose height is controlled by the interdigitated surface electrode structure. In one preferred embodiment, the device comprises a substrate, an intrinsic conductivity layer, said intrinsic layer further comprising a thin highly-doped p+ layer disposed within said intrinsic layer, and interdigitated gate-anode electrodes disposed on the surface of the intrinsic layer. In yet another preferred embodiment, the gate-anode surface electrode structure creates a nonplanar potential barrier and the thermoionic current flows within the vicinity of a point underneath the anode electrode. In this embodiment, there is no need for the thin and highly doped layer.

BRIEF DESCRIPTION OF THE DRAWING

FIG. 3 is a schematic idealized representation of the geometry of the surface electrodes for a device according to this invention;

FIG. 4 shows the potential distribution at the surface, i.e., the potential distribution at the gate and anode electrodes, of a device according to this invention;

FIG. 5 is a sectional view of yet another embodiment of a device according to this invention; and FIG. 6 is a schematic representation of devices of this invention which may be used in combinationn to form logic devices such as an inverter.

DETAILED DESCRIPTION

Figure 1:
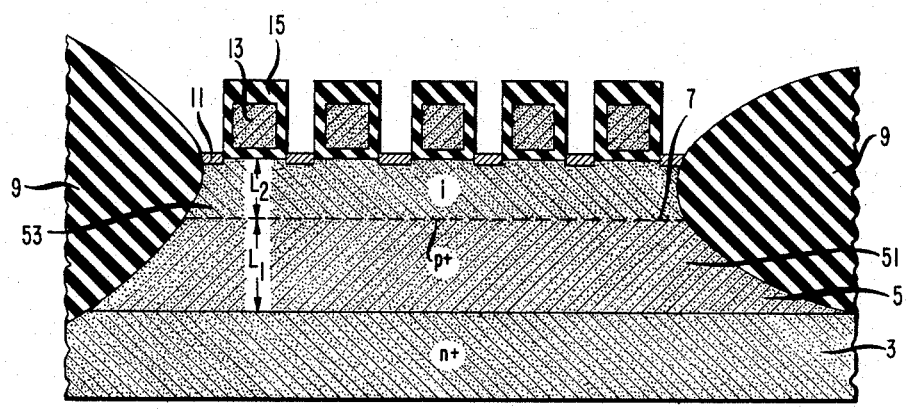
FIG. 1 is a cross-sectional view of one embodiment of a device according to our invention.

An exemplary embodiment of a device according to our invention is shown in cross section in FIG. 1. In this and other Figures, the elements of the device are not shown to scale for reasons of clarity. The device comprises a substrate 3 and an epitaxial layer 5. Layer 5 further comprises layer 7 which thus divides layer 5 into layers 51 and 53. Layers 51 and 53 have thicknesses indicated as $L_1$ and $L_2$, respectively. Layer 7 is thin and highly doped. The thickness of layer 7 is infinitesimal compared to that of layer 5, for example, tens of Angstroms, and should generally be less than $10^{-6}$ cm thick and doped to a concentration of at least approximately $10^{18}/cm^3$. The device depicted further comprises a plurality of anode electrodes 11, a plurality of gate electrodes 13, and a plurality of oxide layers 15. The anode and gate electrodes form, as explained later, an interdigitated surface electrode structure. The device depicted further comprises field oxides 9. The latter provides lateral electrical isolation between devices when a plurality of devices are fabricated on a single substrate.

Substrate 3 is highly doped and has a first conductivity type. Layer 5 is nominally undoped, i.e., layers 51 and 53 are nominally undoped and have intrinsic conductivity; and layer 7 is highly doped with a second conductivity type. The acceptors or donors in layer 7 are completely ionized and form a sheet of negative or positive charge which forms a potential barrier in layer 5. In a first preferred embodiment, the semiconductor comprises silicon and the first conductivity type is n-type and the second conductivity type is p-type. Substrate 3 forms one terminal of the device and the anode and gate electrodes form the other two terminals.

Figure 2:
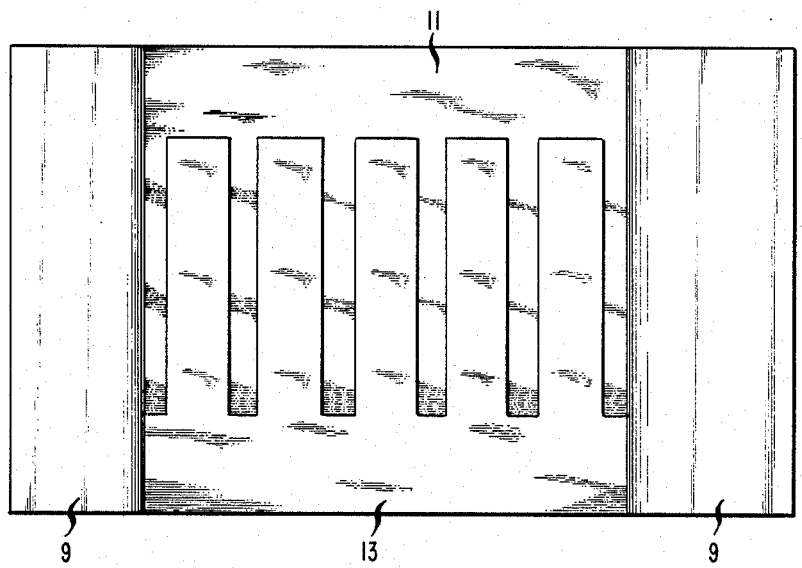
FIG. 2 is a top view of the device depicted in FIG. 1.

The latter two terminals are arranged in an interdigitated periodic pattern on the device surface, i.e., on the top of layer 53. The period is defined by the distance between adjacent gate or anode electrodes, i.e., the distance between two adjacent gate electrodes. Electrodes 11 represent a metallized n+ contact or a silicide layer and these electrodes are connected on one side to a metallic pad which forms the terminal for the anode electrodes. Electrodes 13 are connected to another metallic pad which forms the terminal for the gate electrodes. In a preferred embodiment, the latter electrode comprises a polysilicon structure surrounded by oxides as shown. The interdigitated gate-anode electrode structure is depicted in a top view in FIG. 2. Depicted are field oxide 9, anode electrodes 11, and gate electrodes 13.

Devices according to our invention may be conveniently fabricated by growth techniques, such as molecular beam epitaxy (MBE), which permit the fabrication of thin and sharply defined epitaxial layers. Growth of the required epitaxial layers is by techniques well known to those skilled in the art and need not be described in detail.

The separate contacts forming the anode and the gate electrodes may be made by several processing schemes that are well known in the art. The simplest scheme has a polysilicon gate which is grooved after suitable lithographic patterning, for example, electron beam or interference photolithography, according to the desired pattern by, for example, reactive ion etching and insulated by growth of an oxide layer. The anode electrodes are then formed by a silicide Schottky-drain structure. The resulting structure is the one depicted in FIGS. 1 and 2.

The requirements with respect to processing and device dimension tolerance, become progressively more demanding as the operating speed of the device increases. For example, in the contemplated picosecond range of operation, the intrinsic layer thickness will be approximately 0.3 μm and the surface electrode stripes will be approximately 1500 Angstroms in width. Fabrication of devices that conform to such tolerances may be achieved by using X-ray or electron beam lithography or, alternatively, interference photolithography may be used. The last-named technique appears to be the presently preferred technique as it has the advantage of being capable of higher resolution than are X-ray or electron beam lithography. Of course, for slower device operation, device dimensions are neither so small or so critical and other pattern delineation techniques may be used.

The operation of the device and the selection of device parameters will be better understood from the following discussion. The output current in the device is due to charge injection. The cathode work function, which is given by the potential between the top of the potential barrier and the substrate, is nonuniform and varies in a direction perpendicular to the long dimension of the surface electrodes, i.e., the direction parallel to, for example, the bottom of the substrate. For any combination of the anode and gate voltages, $V_A$ and $V_G$, respectively, the electric field within the intrinsic layer 5 may be thought of as being due to a uniform part which emanates from a conducting plane at a constant average potential and a nonuniform oscillating part. This is conceptually rather similar to regarding to field as being a multipole expansion having the appropriate symmetry. The field is mainly multipolar close to the surface electrodes and the oscillation of the potential from stripe to stripe, i.e., from interdigitated finger to interdigitated finger, is appreciable. However, far from the surface, the potential is uniform and the transition from the near zone to the far zone occurs at a characteristic distance which is approximately equal to or less than the size of surface dipoles, that is, the period of the pattern of the stripes on the surface. Beyond this distance, the nonuniform part of the potential drops off exponentially. The characteristic length, $\lambda$, of the inhomogeneous region is approximately $\lambda = d/2\pi$, where d is the period of the surface electrodes. The period of the surface electrodes, i.e., the interdigitated structure, should be less than approximately 1.0 μm.

The barrier height, V, when the barrier in the far field is $V = AV_A + GV_G$, where $A = S_A/S$ and $G = S_G/S$ where $S_A$ and $S_G$ are the anode and gate areas, respectively, and $S = S_A + S_G$. The ratio $S_G/S_A$ primarily determines the voltage gain. For best device performance, $S_A$ should be less than $S_G$.

For optimum performance of the device, it is necessary that the top of the triangular barrier fall into the far zone. Calculation of the near zone and the far zone dimensions depends upon the dimensions of the interdigitated surface electrodes and is done by techniques well known to those skilled in the art which therfore need not be discussed in detail. When this condition is satisfied, the cathode work function, that is, the barrier height for thermionic emission, and therefore the thermionic current, is controlled by the gate voltage. Thus, the transconductance has an exponential dependence on the gate voltage, although this dependence ceases at some current value and therefore limits the charge injection.

This limitation is brought about by two phenomena. First, there is a slowing down of the effective diffusion velocity on the uphill slope of the triangular barrier as the steepness of the barrier decreases. Second, there is carrier accumulation on the downhill slope of the barrier which screens the influence of the gate on the barrier height. Which phenomena is more important in device operation depends on the barrier geometry and substrate doping. For example, when $L_1$ and $L_2$ are each approximately $10^{-5}$ cm and the substrate doping, $N_D$, is much less than $N_C$, which is the effective density of states in the conduction band, the second phenomena is more important. When the top of the barrier is located in the near zone of the multiple expansion, the period of the gate-anode stripe is larger than the thickness of the intrinsic layer. The result is that when a negative voltage is applied to the gate, the barrier height varies periodically in the direction perpendicular to the long dimension of the surface electrode and consequently the current flow occurs mainly in the region under the anode stripes. The result is that the gate voltage has less control over the current than it had for the preceding case.

The idealized electrode structures are shown in side view in FIG. 3. The substrate electrode is at the bottom, i.e., $y=0$, and the surface electrodes are at $y=L_1+L_2$. The idealized voltage variations between the surface electrodes are depicted in FIG. 4 with the voltage being platted vertically. The gate and anode voltages are $V_G$ and $V_A$, respectively.

An exemplary transistor has the following approximate device parameters: $L_1$ and $L_2$ are approximately 2000 and 1000 Angstroms, respectively, $N_D$ is approximately $2 \times 10^{17}$ cm$^{-3}$ and the surface charge density of the p+ layer is approximately $3 \times 10^{11}$ cm$^{-2}$. The surface electrode period is approximately 0.3 μm. The transconductance ideality factor is 2.2, the maximum transconductance, a $g_m$, is 200 mA/V and the gate delay is 1.5 picoseconds. If $I_{ON}/I_{OFF}$ is 10 and $I_{ON}$ is 20 mA, then $\Delta V_G$ is 200 mV at room temperature. It should be noted that the small voltage required for switching eliminates parasitic bipolar effects such as p+ latch-up.

Variations in the embodiment described with respect to FIGS. 1-4 are contemplated. For example, the thin and highly doped layer depicted in FIG. 1 may be omitted with only small loss in voltage gain thus simplifying both the device and its fabrication. There is no longer a planar equipotential barrier and the thermionic current flows in the vicinity of saddle points under the anode electrodes. At low currents, there is an exponential dependence of the current on voltage. At high currents, the current is space charge limited. It is also contemplated that a plurality of devices may be fabricated on a single substrate.

Furthermore, two or more devices having complementary types of conductivity may be fabricated on the same substrate. One embodiment of such a structure is shown in cross section in FIG. 5. The structure comprises substrate 300 having a first conductivity type, a first region 304 having intrinsic conductivity, a second region 302 which is highly doped and has a second conductivity type, field oxides 306, anode electrodes 308, gate electrodes 310, and oxide layers 312. In one preferred embodiment, the first conductivity type is p-type and the second conductivity type is n-type. The structure depicted comprises two transistor devices according to our invention. The first device comprises regions 302 and 304 and is thus analogous to the device depicted in FIG. 1 without the highly doped layer. The complementary device comprises region 304 and substrate 300. The p-type substrate acts as a source for the p-type transistor and the source of the n-type transistor is provided by region 302 which is formed by, for example, deep diffusion of donors in the substrate. The intrinsic layer, which has a thickness L, serves as the base for both transistors. The gate and anode terminals are arranged as an interdigitated pattern of electrodes on top of the intrinsic layer as described with repsect to FIG. 2. The gate electrodes represent an MOS (silicide-gate oxide-silicon) structure common to both transistors. The anode electrodes are in contact with the top of the intrinsic layer and the contact is made ohmic for electrons in the n-type transistor and holes in the p-type devices, for example, by n+ and p+ polysilicon drain structures. The anode electrodes are connected and their common potential is the output voltage of the structure.

The equivalent circuit for the structure depicted in FIG. 5, which is an inverter, is shown in FIG. 6. The power supply lines to the device are beneath the intrinsic base layer with voltage applied between the n diffusion region and the p substrate. The sources of both transistors are biased by $V_{DD}$ with respect to one another and form a forward biased p-n+ junction. Nevertheless, there is a small current for $V_{DD}$ less than or approximately equal to 0.5 volts. Electrically, the circuit is equivalent to two variable resistances in series which divide $V_{DD}$ to the ground voltage depending on the potential applied to the gate. If an appropriate silicide, for example, TaSi$_2$, is used for the gate metallization, then the two devices may be regarded as essentially symmetrical. Both are normally OFF, that is, both are in the OFF state when the gate voltage is 0 with respect to its source. Thus, the n-type transistor is OFF and the p-type transistor is ON when $V_G$ equals ground potential, and when $V_G$ equals $V_{DD}$, the p-type transistor is OFF and $V_{out}$ is equal to ground potential. The circuit depicted is thus an inverter and the device can operate at a volage as low as half the energy gap. Such devices can be used in complementary logic circuits in a manner analogous to CMOS devices. Operation at voltages less than the bandgap completely eliminates all parasitic bipolar latch-up effects which are troublesome in conventional CMOS devices.

Other variations of the embodiments described will be readily though of by those skilled in the art. For example, the device depicted in FIG. 5 could further comprise a charge sheet which would, of course, have different conductivities in the two transistors. Additionally, a plurality of devices may be fabricated on a single substrate.

What is claimed is:

1. A device comprising a substrate having a first conductivity type, a first layer disposed on said substrate and having intrinsic conductivity, gate and anode electrodes disposed on the surface of said intrinsic conductivity layer, said gate and anode electrodes forming an interdigitated structure.

2. A device as recited in claim 1 in which said first layer further comprises a thin and highly doped layer, said thin and highly doped layer being disposed between said surface and said substrate.

3. A device as recited in claim 2 in which said thin and highly doped layer is spaced from said surface by a distance greater than or equal to the period of said interdigitated structure.

4. A device as recited in claim 3 in which said thin and highly doped layer has a doping concentration of at least $10^{18} cm^{-3}$.

5. A device as recited in claim 4 in which said thin and highly doped layer has a thickness less than approximately $10^{-6}$ cm.

6. A device as recited in claim 5 in which the period of said interdigitated structure is less than 1.0 μm.

7. A plurality of devices as recited in claim 6 disposed on said substrate.

8. A device as recited in claim 7 in which said first conductivity type is n-type.

9. A device as recited in claim 1 further comprising a highly doped region having said second conductivity type and electrically contacting said substrate and said first layer.

10. A device as recited in claim 9 in which said first conductivity type is p-type.

11. A device as recited in claim 10 in which the period of said interdigitated structure is less than 1.0 μm.

12. A plurality of devices as recited in claim 11 disposed on said substrate.

* * * * *